United States Patent

Jeng

[11] Patent Number: 5,963,820
[45] Date of Patent: *Oct. 5, 1999

[54] METHOD FOR FORMING FIELD OXIDE OR OTHER INSULATORS DURING THE FORMATION OF A SEMICONDUCTOR DEVICE

[75] Inventor: Nanseng Jeng, Boise, Id.

[73] Assignee: Micron Technology, Inc., Boise, Id.

[*] Notice: This patent is subject to a terminal disclaimer.

[21] Appl. No.: 08/819,618

[22] Filed: Mar. 17, 1997

Related U.S. Application Data

[63] Continuation of application No. 08/540,866, Oct. 11, 1995, Pat. No. 5,612,248.

[51] Int. Cl.⁶ ................................................. H01L 21/76
[52] U.S. Cl. ........................... 438/446; 438/444; 438/445; 438/451
[58] Field of Search ................................. 438/444, 445, 438/446, 439, 448, 452

[56] References Cited

U.S. PATENT DOCUMENTS

| | | | |
|---|---|---|---|
| 4,398,992 | 8/1983 | Fang et al. . | |
| 4,563,227 | 1/1986 | Sakai et al. . | |
| 4,959,325 | 9/1990 | Lee et al. | 437/30 |
| 4,965,221 | 10/1990 | Dennison et al. | 437/70 |
| 5,049,520 | 9/1991 | Cathey | 437/60 |
| 5,087,586 | 2/1992 | Chan et al. | 437/72 |
| 5,118,641 | 6/1992 | Roberts | 437/69 |
| 5,254,494 | 10/1993 | Van Der Plas et al. . | |
| 5,318,922 | 6/1994 | Lim et al. . | |
| 5,332,682 | 7/1994 | Lowrey | 437/48 |
| 5,358,894 | 10/1994 | Fazan et al. | 437/70 |
| 5,416,348 | 5/1995 | Jeng | 257/297 |
| 5,438,016 | 8/1995 | Figura et al. | 437/67 |
| 5,453,397 | 9/1995 | Ema et al. . | |
| 5,457,067 | 10/1995 | Han . | |
| 5,470,783 | 11/1995 | Chiu et al. . | |
| 5,472,904 | 12/1995 | Figura et al. | 437/67 |
| 5,472,906 | 12/1995 | Shimizu et al. . | |
| 5,492,853 | 2/1996 | Jeng et al. | 437/60 |
| 5,580,821 | 12/1996 | Mathews et al. | 437/187 |
| 5,612,248 | 3/1997 | Jeng | 438/448 |

FOREIGN PATENT DOCUMENTS

| | | | |
|---|---|---|---|
| 0092547 | 5/1984 | Japan | 437/72 |
| 92547 | 5/1984 | Japan . | |
| 0219148 | 9/1986 | Japan | 437/69 |
| 219148 | 9/1986 | Japan . | |
| 0014439 | 1/1987 | Japan | 437/73 |
| 14439 | 1/1987 | Japan . | |
| 0304927 | 12/1990 | Japan | 437/73 |
| 304927 | 12/1990 | Japan . | |

OTHER PUBLICATIONS

D.H. Ahn Et Al "A Highly Practical Modified LOCOS Isolation Technology for the 256 Mbit DRAM", IEEE, 1994, pp. 679–682*.

N. Shimizu Et Al, "A Poly–Buffer Recessed LOCOS Process for 256 Mbit DRAM Cells" IEEE 1992, pp. 279–282*.

*Primary Examiner*—Trung Dang

[57] ABSTRACT

A method for forming a semiconductor device comprises the steps of forming an oxide over a silicon layer, forming a blanket first nitride layer over the oxide layer and the silicon layer, and etching the first nitride layer and the oxide layer to form a sidewall from at least the oxide layer and the first nitride layer. Next, a second nitride layer is formed over the sidewall and an oxidizable layer is formed over the second nitride layer. The oxidizable and the second nitride layers are etched to form a spacer from the oxidizable layer from and the second nitride layer, and the oxidizable and the silicon layers are oxidized.

12 Claims, 2 Drawing Sheets

METHOD FOR FORMING FIELD OXIDE OR OTHER INSULATORS DURING THE FORMATION OF A SEMICONDUCTOR DEVICE

This is a continuation of U.S. application Ser. No. 08/540,866, filed Oct. 11, 1995 and issued Mar. 18, 1997 as U.S. Pat. No. 5,612,248.

FIELD OF THE INVENTION

The invention relates to the field of semiconductor manufacture, and more specifically to the formation of an isolation region such as field oxide.

BACKGROUND OF THE INVENTION

Many types of semiconductor devices such as dynamic random access memories (DRAMs), static rams (SRAMs), programmable memories, and microprocessors are formed in much the same way. Layers of oxide, nitride, and polycrystalline silicon (polysilicon or poly) are formed over a substrate such as silicon to form field and gate oxide, capacitor cell plates, word and digit lines, and various other structures.

To form a thick oxide layer such as field oxide, a thin blanket oxide layer is formed over a substrate. A blanket layer of protective material such as nitride is formed over the oxide layer, and a patterned mask is formed over the protective layer to cover regions of protective material while other regions of protective material remain exposed. The exposed protective regions (and often the underlying oxide layer) are etched to expose the underlying oxide layer (or underlying substrate). The substrate is then oxidized to form the field oxide. Other procedures using the local oxidation of silicon (LOCOS) are known.

Encroachment of isolation material such as oxide under adjacent nitride during field oxidation is well documented. Encroachment decreases the size of the usable silicon area for transistor formation, thereby decreasing transistor packing density on silicon. The following patents assigned to Micron Technology, Inc. are related to encroachment and/or field oxide, and are incorporated herein by reference: U.S. Pat. No. 4,959,325 issued Sep. 25, 1990; U.S. Pat. No. 4,965,221 issued Oct. 23, 1990; U.S. Pat. No. 5,049,520 issued Sep. 17, 1991; U.S. Pat. No. 5,087,586 issued Feb. 11, 1992; U.S. Pat. No. 5,118,641 issued Jun. 2, 1992; U.S. Pat. No. 5,332,682 issued Jul. 26, 1994; U.S. Pat. No. 5,358,894 issued Oct. 25, 1994; U.S. Pat. No. 5,438,016 issued Aug. 1, 1995.

A process which reduces field oxide encroachment effects to maximize the usable silicon area during the formation of a transistor would be desirable.

SUMMARY OF THE INVENTION

In one embodiment of a method for forming a semiconductor device a first insulation-resistant layer, which forms at least a portion of a sidewall, is formed over a semiconductor layer. A second insulation-resistant layer is formed over at least a portion of the sidewall, and an oxidizable layer is formed over the second insulation-resistant layer. The oxidizable layer is oxidized along with a portion of the semiconductor layer.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
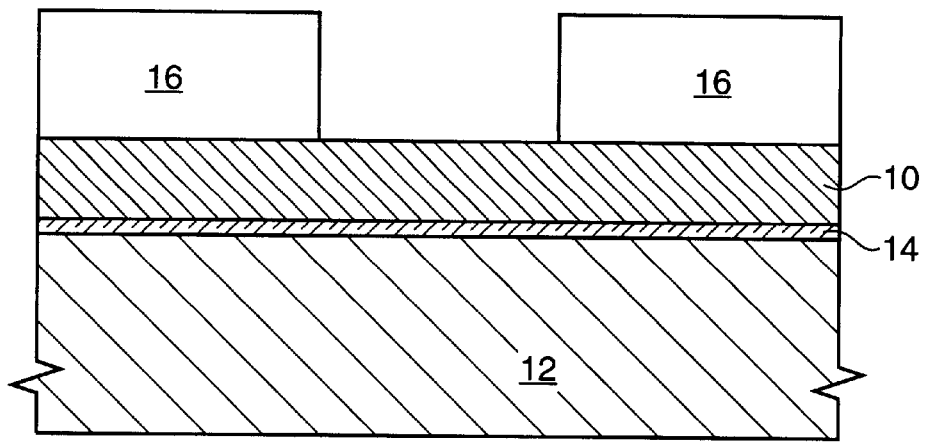
FIGS. 1–5 are cross sections depicting various stages of one possible embodiment of the invention.
Figure 2:
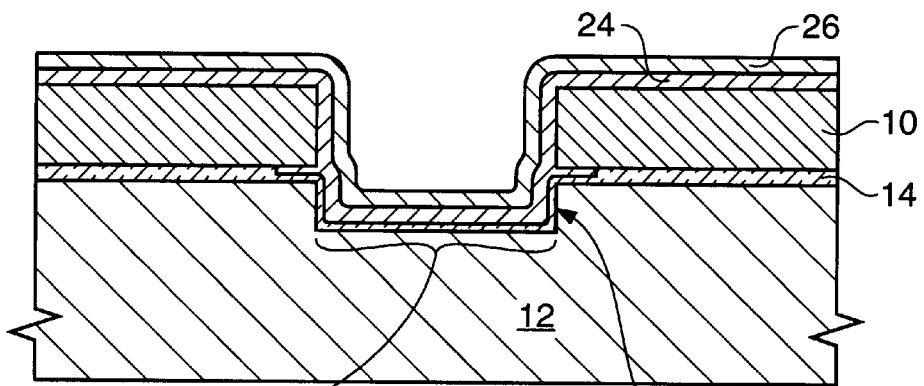

One embodiment of an inventive method for forming a semiconductor device comprises the steps of forming a patterned first insulation-resistant layer 10 such as nitride over a semiconductor layer 12 such as a silicon substrate, as shown in FIG. 1. An interposed buffer layer 14, for example a pad oxide insulation layer, can optionally be used to reduce the possibility of damage to the semiconductor layer 12. Patterning of the insulation-resistant layer can be completed by forming a mask layer 16 over a blanket insulation-resistant layer then etching the insulation-resistant layer to result in layers 10, 12, 14, and 16 as shown in FIG. 2. If the buffer layer is used it may be etched to undercut the first insulation-resistant layer such that a space is formed between the first insulation-resistant layer 10 and the semiconductor layer. As shown in FIG. 2, the first insulation-resistant layer 10 forms at least a portion of a sidewall. Also shown in FIG. 2, a portion of the substrate 12 is optionally etched to form a trench 20 in the substrate 12, either with a single etch or with a different etch from the first insulation-resistant layer etch. In this embodiment the sidewall is formed by the buffer layer 14 and the substrate 12 as well as the first insulation-resistant layer 10. The substrate 12 is then oxidized to form oxide layer 22 which reduces damage from subsequent layers.

Figure 3:
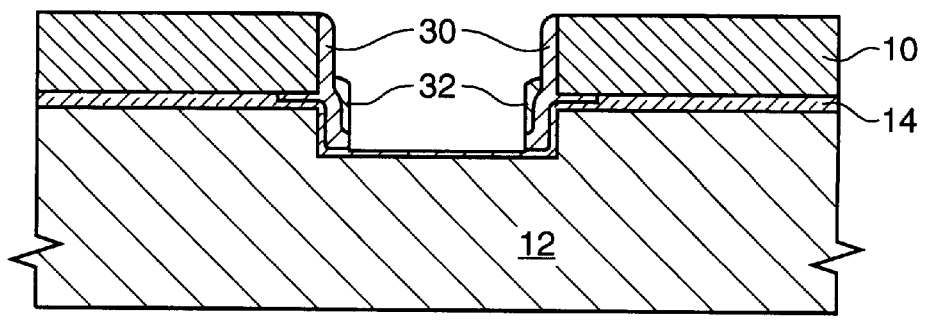

Next, a second insulation-resistant layer 24, for example a second layer of nitride, is formed over the sidewall. An oxidizable layer 26 is formed over the second insulation-resistant layer as shown in FIG. 2. If the buffer layer 14 is undercut, the second insulation-resistant layer 24 will fill in the space resulting from the etch as shown in FIG. 2. The oxidizable layer 26 can be silicon, for example polycrystalline silicon, although other materials may function adequately. An anisotropic etch such as a spacer etch is completed to etch the second insulation-resistant layer to etch and the oxidizable layer which results in the insulation-resistant layer 30 and the oxidizable layer 32 as shown in FIG. 3

Figure 4:
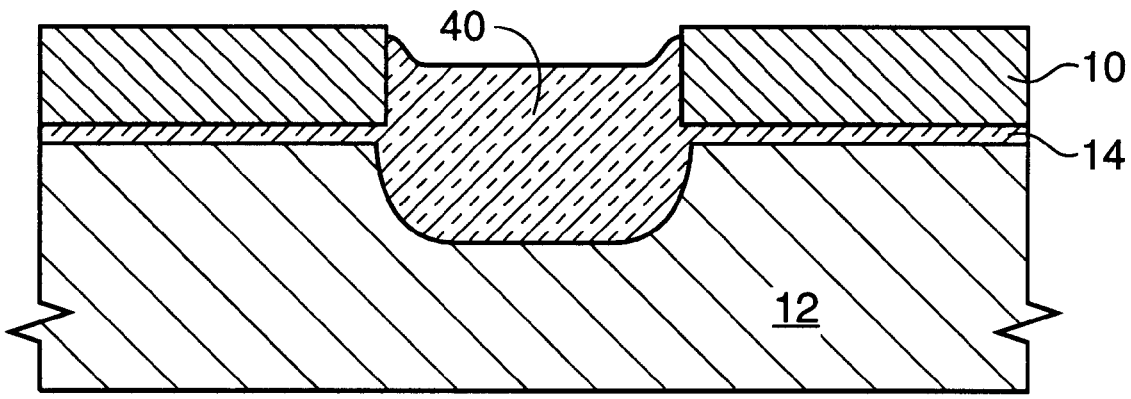
Figure 5:
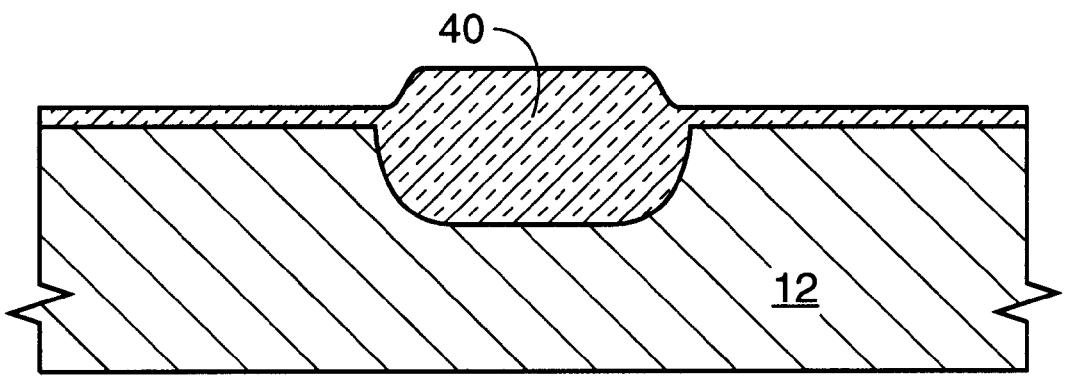

Next, the remaining oxidizable layer 32 is oxidized, which consumes the oxidizable layer 32 quickly, consumes the substrate 12 more slowly than the oxidizable layer 32, and even more slowly oxidizes the second insulation-resistant layer 30. Ideally, just as the second insulation-resistant layer 30 is completely oxidized, the oxide layer to be formed (for example field oxide) is completed thereby minimizing the encroachment of the oxide under the first insulation-resistant layer 10. This results in the oxide structure 40 of FIG. 4, such as field oxide. Any remaining portion of the first insulation-resistant layer 10 is removed to result in the structure of FIG. 5.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used during the formation of a semiconductor device comprising the following steps:

forming a first layer over a semiconductor layer, said first layer forming at least a portion of a sidewall;

forming a second layer over said sidewall;

forming a third layer over said second layer, wherein said first and second layers oxidize at a substantially slower rate than said third layer and said semiconductor layer; and oxidizing said third layer, a portion of said semiconductor layer, and oxidizing all of said second layer over said sidewall.

2. The method of claim 1 wherein said first and second layers comprise nitride and said third layer comprises silicon.

3. The method of claim 1 further comprising the step of etching said semiconductor layer wherein said sidewall comprises said first layer and said semiconductor layer.

4. The method of claim 1 wherein said oxidation step is completed at about the same time that said second layer is completely oxidized.

5. A method which reduces encroachment during the formation of a semiconductor device comprising the following steps:

providing a wafer substrate assembly comprising at least a semiconductor wafer, an exposed first nitride layer formed over said wafer, a first oxide layer separating said wafer from said first nitride layer, an exposed second oxide layer formed on said wafer, and at least one sidewall formed from at least said first nitride layer and from said first oxide layer;

forming a second nitride layer over said sidewall;

forming a silicon layer on a portion of said second nitride layer and over a portion of said exposed second oxide layer;

oxidizing said silicon layer, said semiconductor wafer, and completely oxidizing said second nitride layer.

6. The method of claim 5 further comprising the step of completing said oxidation step at about the same time that said second nitride layer is completely oxidized.

7. The method of claim 5 further comprising the step of etching said first nitride layer subsequent to said oxidation step.

8. A method used during the formation of a semiconductor device comprising the following steps:

providing a wafer substrate assembly comprising at least a semiconductor wafer, an exposed first oxidation-resistant layer formed over said wafer, and a first oxide layer separating said wafer from said first oxidation-resistant layer;

etching first oxidation-resistant layer, said first oxide layer, and said wafer to form a sidewall from said first oxidation-resistant layer, said first oxide layer, and said wafer, wherein said etch exposes said wafer and removes a portion of said first oxide layer between said first oxidation-resistant layer and said wafer to form a space therebetween;

forming a second oxide layer on said exposed wafer;

forming a second oxidation-resistant layer on said sidewall, wherein said second oxidation-resistant layer fills in said space;

forming an oxidizable layer on said second oxidation-resistant layer;

oxidizing said oxidizable layer, said second oxidation-resistant layer, and said wafer.

9. The method of claim 8 wherein said oxidizing step completely oxidizes said second oxidation-resistant layer.

10. The method of claim 9 further comprising the step of completing said oxidation step at about the same time that said second oxidation-resistant layer is completely oxidized.

11. The method of claim 8 further comprising the step of etching said first oxidation-resistant layer subsequent to said oxidation step.

12. The method of claim 8 wherein said oxidizing step converts said second oxidation-resistant layer which fills said space to oxide.

* * * * *